:::
United States Patent [19]

Taniguchi et al.

[11] Patent Number: 5,263,190

[45] Date of Patent: Nov. 16, 1993

[54] VEHICULAR RADIO RECEIVER HAVING MUTING CIRCUITRY FOR SUPPRESSING NOISES CAUSED BY RECEIVER DATA PULSES

[75] Inventors: Tatsuaki Taniguchi, Fuchu; Keiji Takao, Higashi-hiroshima, both of Japan

[73] Assignee: Mazda Motor Corporation, Hiroshima, Japan

[21] Appl. No.: 952,476

[22] Filed: Sep. 28, 1992

Related U.S. Application Data

[63] Continuation of Ser. No. 504,903, Apr. 5, 1990, abandoned.

[30] Foreign Application Priority Data

Apr. 6, 1989 [JP] Japan ................................. 1-89408

[51] Int. Cl.$^5$ ............................................. H04B 1/10
[52] U.S. Cl. ........................... 455/297; 455/152.1; 455/223; 455/345
[58] Field of Search ............... 455/344, 345, 349, 352, 455/218, 219, 223, 297, 152.1

[56] References Cited

U.S. PATENT DOCUMENTS

| | | | |
|---|---|---|---|
| 2,973,431 | 2/1961 | Sontheimer | 455/345 |
| 3,793,590 | 2/1974 | Etling et al. | 455/345 |
| 3,995,219 | 11/1976 | Rasehorn et al. | 455/297 |
| 4,127,743 | 11/1978 | Ozawa et al. | 455/218 |
| 4,525,869 | 6/1985 | Hamada et al. | 455/345 |
| 4,531,232 | 7/1985 | Sakurai | 455/345 |
| 4,683,386 | 7/1987 | Kamikawara | 455/219 |
| 4,837,802 | 6/1989 | Higashiyama et al. | 455/34.1 |

FOREIGN PATENT DOCUMENTS 59-94929 5/1984 Japan .

*Primary Examiner*—Reinhard J. Eisenzopf
*Assistant Examiner*—Edward Urban
*Attorney, Agent, or Firm*—Wenderoth, Lind & Ponack

[57] ABSTRACT

A vehicular radio receiver includes a receiver main body provided adjacent to an antenna mounted on a vehicle body, a receiver operation unit provided in a compartment of the vehicle spaced from the receiver main body for sending a pulse signal for operating the receiver main body thereto, and a control circuit for forcibly and continuously lowering an output derived from the receiver main body during a time in which the pulse signal is transmitted from the receiver operation unit. Noises caused by the pulse signal transmitted to the receiver main body from the receiver operation unit are prevented from being audibly output from a speaker.

4 Claims, 6 Drawing Sheets

VEHICULAR RADIO RECEIVER HAVING MUTING CIRCUITRY FOR SUPPRESSING NOISES CAUSED BY RECEIVER DATA PULSES

This application is a continuation of now abandoned application, Ser. No. 07/504,903, filed Apr. 5, 1990.

BACKGROUND OF THE INVENTION

1. Field of the Invention

The present invention relates to a radio receiver used in an automobile vehicle.

2. Description of the Prior Art

As a receiver for an automobile vehicle, there is known a diversity receiver in which two antennas having a directivity different from each other are employed. In this diversity receiver, the one antenna having better receiving conditions is used for reception by switching between the antennas as disclosed in, for example, Japanese Patent Publication No. 94929/1984, in order to always receive FM broadcasting, AM broadcasting and so forth under good conditions.

Such a receiver generally comprises two antennas provided adjacent to a rear trunk of a vehicle body, a receiver unit located in a compartment of the vehicle, and a feeder connecting the receiver unit to the antennas. In this constitution, there is a problem in that the receiving condition, especially the AM broadcasting receiving condition, is not good because the length of the feeder connecting the receiver unit to the antennas is very long.

In order to solve the above problem, it might be proposed to divide the receiver unit into a tuner unit (receiver main body) and an operation unit and to provide the tuner unit adjacent to the antennas. Namely, this receiving system comprises the operation unit provided in the compartment, and the tuner unit provided near the antennas and operated by the operation unit by way of remote control, and a feeder connecting between the tuner unit and the antennas.

According to this construction, it is possible to shorten the length of the feeder thereby to suppress the generation of noises during receiving. Furthermore, the required space within the compartment for the aforementioned receiver unit can be reduced since only the operation unit is located in the compartment. With regard to the connection between the tuner unit and the operation unit, the use of a multiple line is preferable to achieve simplification of the connecting wirings.

However, even if the above mentioned noises are suppressed by adopting the technique described above, the pulse signal for operating the receiver main body (tuner unit), sent thereto from the operation unit, are received as noise by the receiver main body through the antennas, and thus the pulse signal is audibly output as noise from a speaker.

SUMMARY OF THE INVENTION

The present invention is devised in consideration of such points, and it is an object thereof to provide a receiver for a vehicle which is free of noises caused by the pulse signal sent to the receiver main body from the receiver operation unit.

In order to accomplish the above mentioned object, the present invention is characterized by comprising a receiver main body provided adjacent to an antenna mounted on a vehicle body; a receiver operation unit, provided in a compartment of a vehicle spaced from the receiver main body, for sending a pulse signal for operating the receiver main body thereto; and a control means for forcibly and continuously lowering an output derived from the receiver main body during a time in which the pulse signal is transmitted from the receiver operation unit.

In this constitution, noises caused by the pulse signal transmitted to the receiver main body from the receiver operation unit are prevented from being audibly output from a speaker.

The receiver operation unit is connected to the receiver main body by a multiple line.

The control means sends a muting signal for operating a muting circuit.

An operational signal sent from the muting circuit lowers the output from the receiver main body between the receiver main body and an amplifier or between the amplifier and the speaker.

The receiver operation unit is mounted near an instrument panel in the compartment of the vehicle.

The control means is integrated with a Phase Locked Loop circuit in one body and accomodated in the receiver main body. According to this construction, countermeasures for shielding may be easily carried out because noise generating sources of the control means and the Phase Locked Loop circuit are unified.

The antenna is disposed on a window of the vehicle body.

Furthermore, the present invention is characterised by comprising a receiver main body provided adjacent to an antenna disposed on a window of a vehicle body; a receiver operation unit, provided near an instrument panel in a compartment of a vehicle spaced from the receiver main body and connected with the receiver main body through a multiple line, for sending a pulse signal for operating the receiver main body thereto; and a control means, integrated with a Phase Locked Loop circuit in one body and accomodated in the receiver main body, for forcibly and continuously lowering an output derived from the receiver main body to operate a muting circuit by sending a muting, signal thereto from the control unit during a time in which the pulse signal is transmitted from the receiver operation unit.

DESCRIPTION OF THE PREFERRED EMBODIMENT

Hereinafter, embodiments according to the present invention will be described with reference to the drawings.

Figure 1:
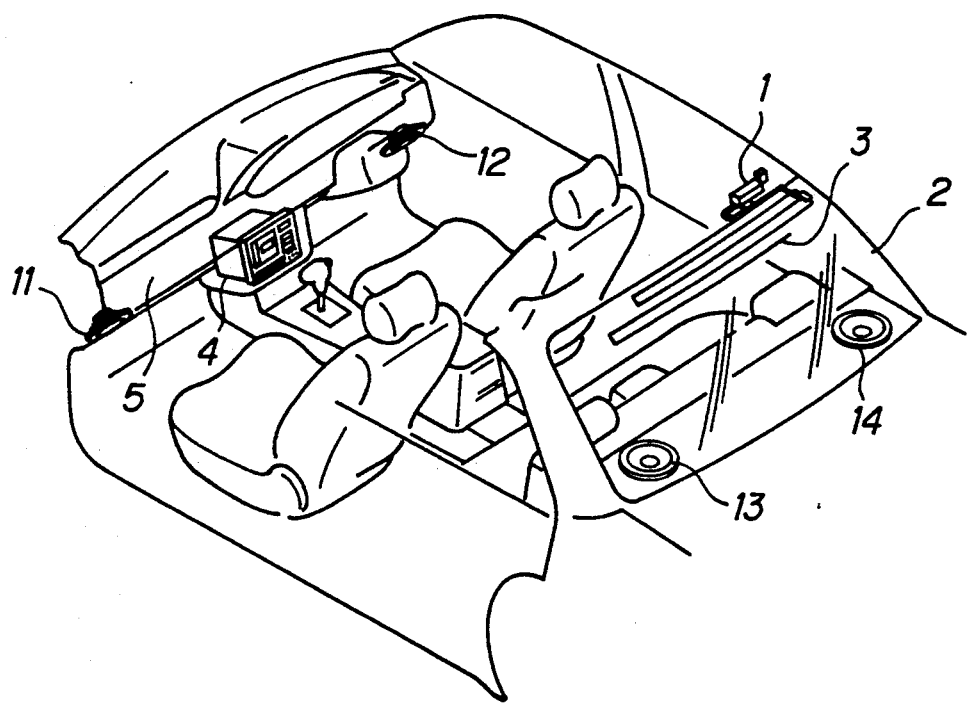
FIG. 1 is a perspective view of a compartment of a vehicle having a receiver according to the present invention.

In FIG. 1, reference numeral 1 is a receiver main body which is diposed, for example, at a rear head area near a printed antenna 3 disposed on a rear window 2.

Reference numeral 4 is a receiver operation unit which is disposed near an instrument panel 5, and the receiver operation unit 4 is connected through a multiple line to the receiver main body 1.

Reference numerals 11 and 12 each denote a front speaker, and reference numerals 13 and 14 each denote a rear speaker.

Figure 2:
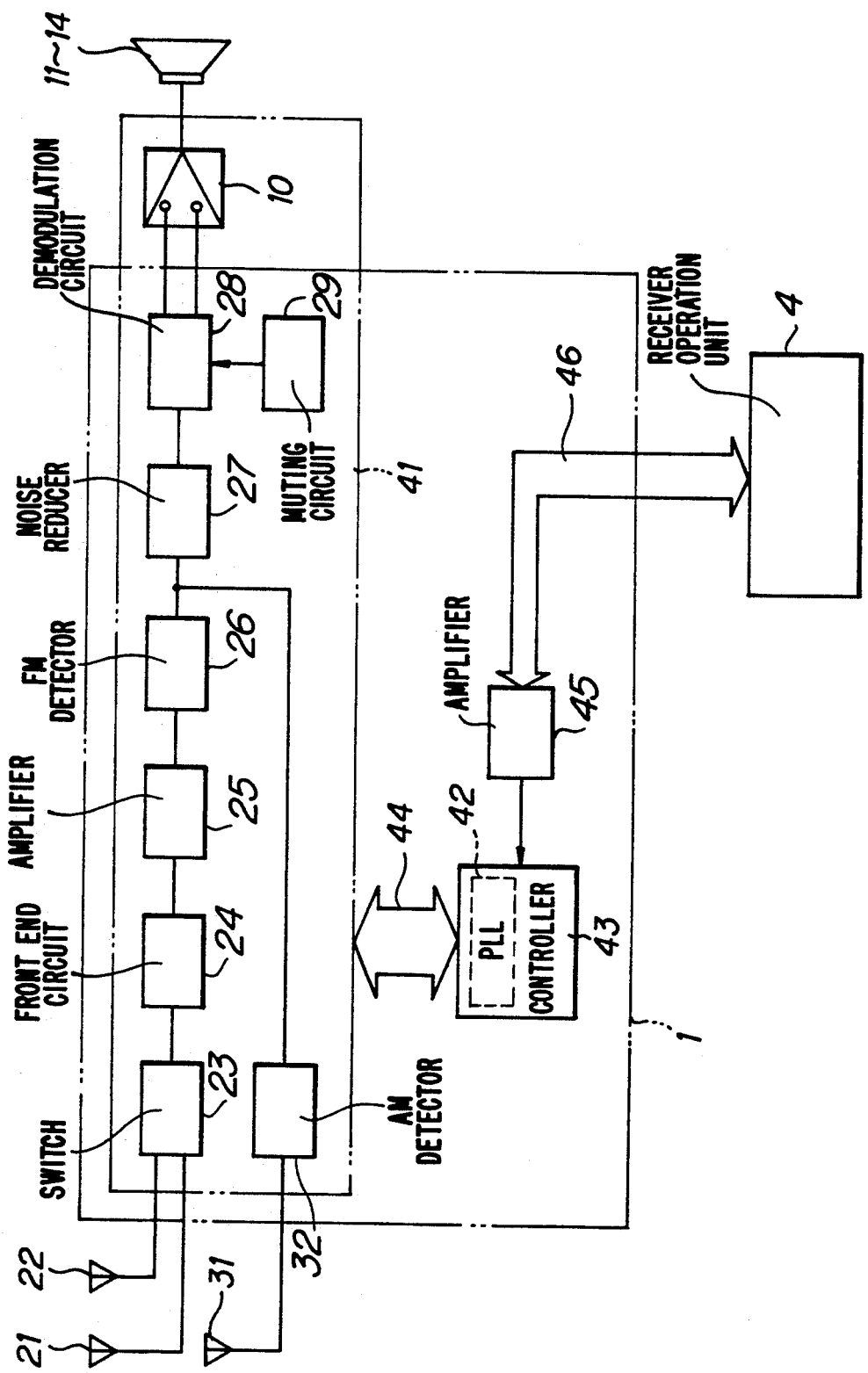
FIG. 2 is a block diagram of a control system.

Next, the receiver main body 1 will be described with reference to FIG. 2.

On the FM receiving side, radio signals are received by antennas 21 and 22 each having a directivity different from the other. Either one of the antennas 21 and 22 which is under a good receiving condition is selected by an antenna change over switch circuit 23 as described hereafter. The radio signal received by either one of the antennas 21 and 22 is applied sequentially to a front end circuit 24 (FE) (which includes a high frequency amplifier for selecting an FM received signal and converting this signal into an intermediate frequency signal, a local oscillator and a mixer), an intermediate frequency amplifier 25(IF), and an FM detector 26 (DET). The signal output from the FM detector is then applied to a noise reducer 27 (NC), a stereo demodulation circuit 28 (MPX) which separetes the FM signal into right and left stereo signals, and an amplifier 10. The thus amplified radio signal is then applied to each of speakers 11, 12, 13 and 14.

On the other hand, on the AM receiving side, a radio signal received by an antenna 31 is directly applied from an AM detection circuit 32 to the noise reducer 27, passed through the stereo demodulator 28, amplified by the amplifier 10, and applied to the speakers 11, 12, 13 and 14.

In this way, a receiving unit 41 is constituted. The receiving unit 41 is electrically connected via a multiple line 44 to a PLL (Phase Locked Loop) circuit 42 for controlling and fixing a frequency of the FM received signal selected at the front end circuit 24, and to a controller 43 for controlling the change over of the FM and AM broadcast receptions, the selection of a frequency, the change over between a stereo system and a monaural system, and so forth. The controller 43 is supplied with a pulse signal for adequate operations via an intermediate frequency amplifier 45 from the receiver operation unit 4 using a multiple line 46. Also, the controller 43 sends a muting signal to a muting circuit 29 so as to forcibly lower an output derived from the receiver main body 1 when the pulse signal is transmitted from the receiver operation unit 4, whereby the output decreased by a muting operation may not be audibly output from the speakers 11, 12, 13 and 14.

Figure 6:
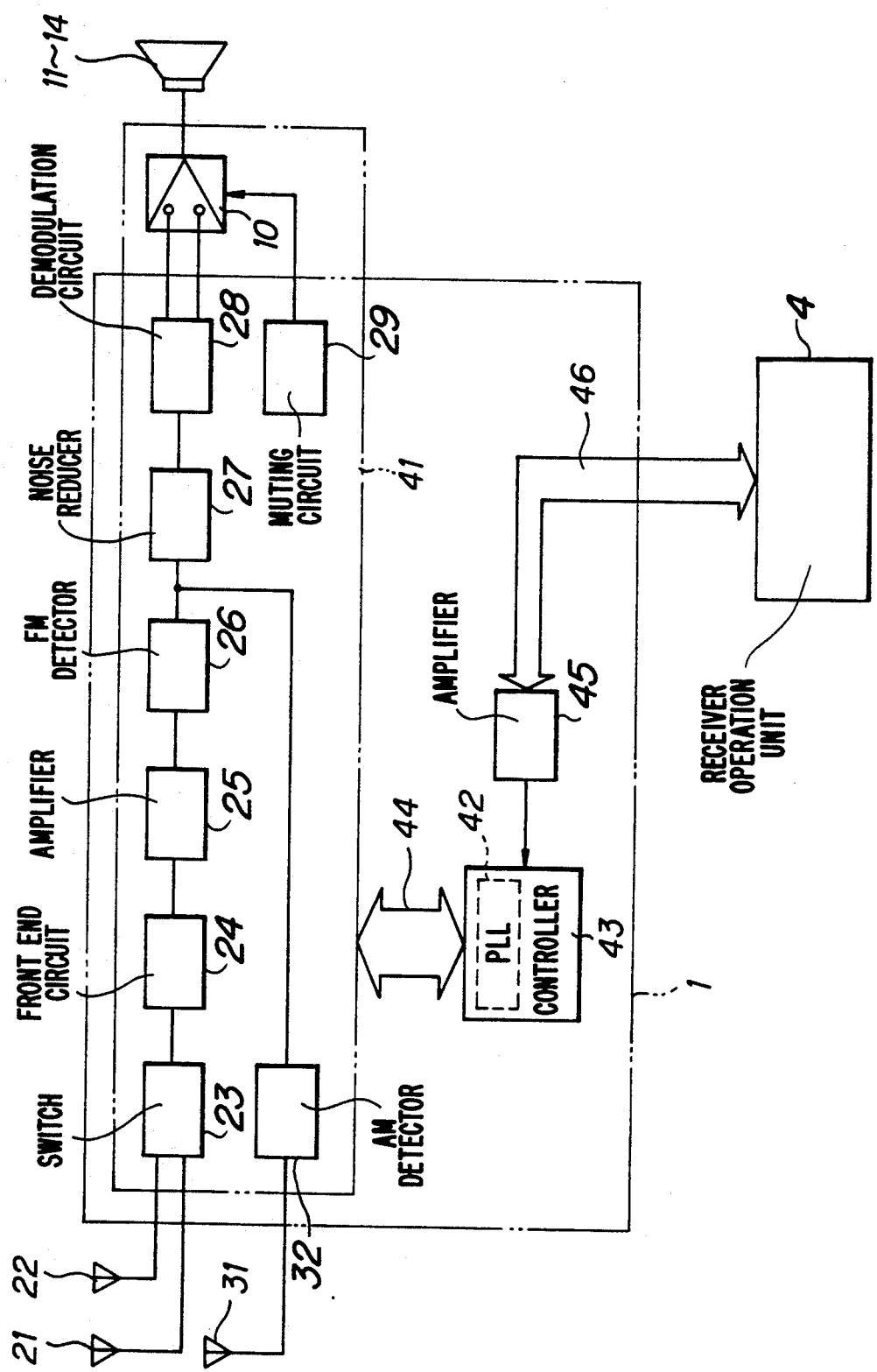
FIG. 6 is a block diagram of another embodiment of a control system of the present invention.

In this embodiment, the muting operation is accomplished by way of inputting an operational signal from the muting circuit 29 into the upstream side of the amplifier 10. The muting operation at the upstream side of the amplifier 10 is easier than that between the amplifier 10 and the speakers 11, 12, 13 and 14 since a voltage value at the former is smaller than that at the latter. On the other hand, FIG. 6 shows another block diagram of the control system. In the control system according to FIG. 6, the operational signal from the muting circuit 29 is input into the amplifier 10. The constitution illustrated in FIG. 6 is approximately the same as the embodiment of FIG. 2 except for the above mentioned manner of inputting the operational signal from the muting circuit 29.

Since the PLL circuit 42 controls a frequency by using pulses in the same way as the controller 43, the PLL circuit 42 forms a noise generating source together with the controller 43. To solve this, the PLL circuit 42 is integrated with the controller 43 in one body so that countermeasures for shielding can be easily carried out.

Figure 3:
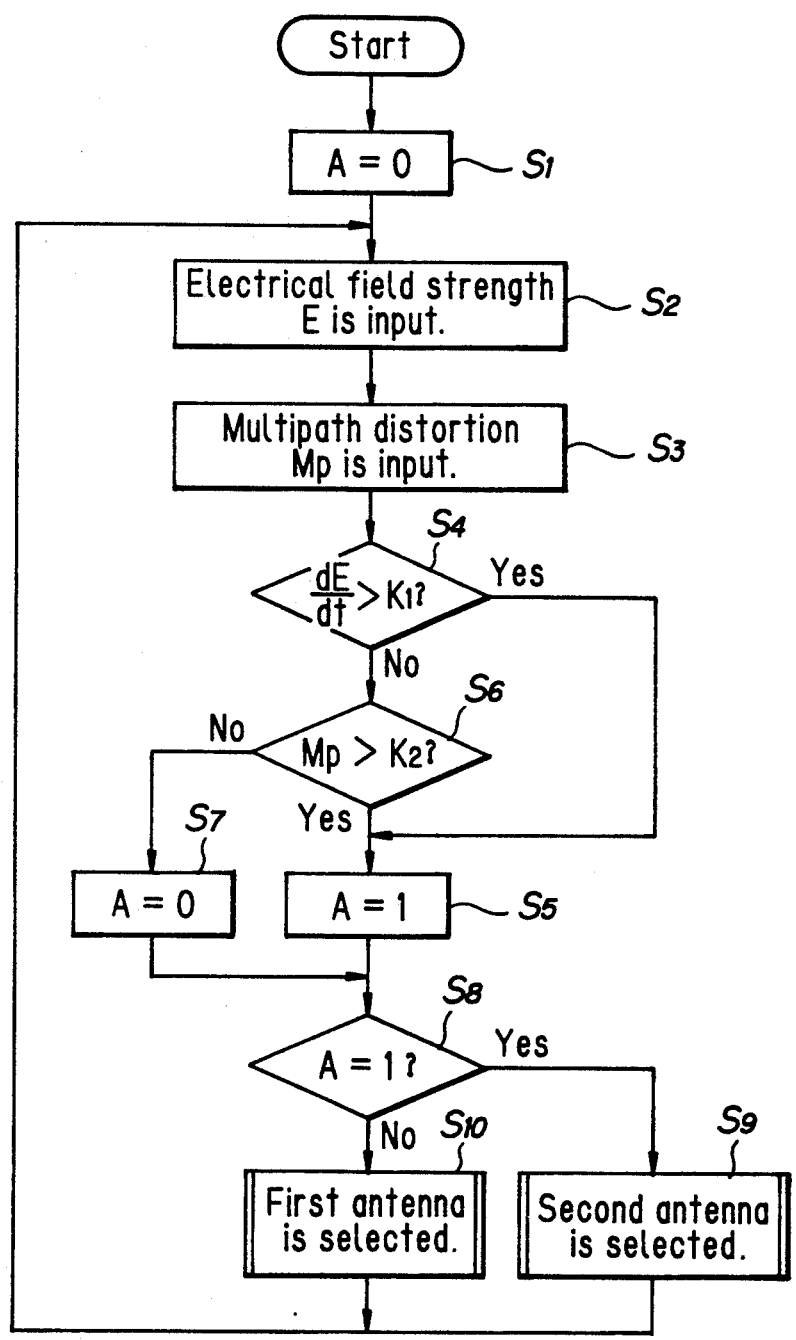
FIG. 3 through FIG. 5 are each a flowchart showing operational control, steps

The control using the antenna change over circuit 23 will now be described with reference to FIG. 3.

At first, upon starting, an antenna flag A is reset to make A=0 (Step S1), to thereby initially select the first antenna 21. Then, an electrical field strength E is input (Step S2), and a multipath distortion Mp is input (Step S3).

Then, it is decided whether or not a rate of change of the electrical field strength E, that is, dE/dt is larger than the set value K1 (Step S4). If dE/dt is larger than K1, A=1 is effected since the first antenna 21 presently used is under bad receiving conditions (Step S5). On the other hand, if dE/dt is not larger than K1, it is further decided whether or not the multipath distortion Mp is larger than the set value K2 (Step S6). If the multipath distortion Mp is larger than the set value K2, since the first antenna 21 is under bad receiving conditions, A=1 is effected (Step S5) and the process is moved to Step S8. If the multipath distortion Mp is not larger than the set value K2, since the first antenna 21 is under good receiving conditions, the process is moved to Step S7, and the antenna flag A is held in the state A=0.

In Step S8, it is decided whether or not A=1. If A equals 1, the second antenna 22 is selected (Step S9), the first antenna 21 is switched with the second antenna 22, and the process is returned to Step S2. On the other hand, if A does not equal 1, the first antenna 21 used at present is adopted and is not switched with the second antenna 22 (Step S10), the present state is maintained and the process is returned to Step S2. According to the above, both the rate of change on the electrical field strength E and the change of the multipath distortion Mp are monitored continuously.

Accordingly, the antenna 21 or 22 which is under better receiving conditions is always selected, thereby allowing good receiving conditions to be maintained.

Figure 4:
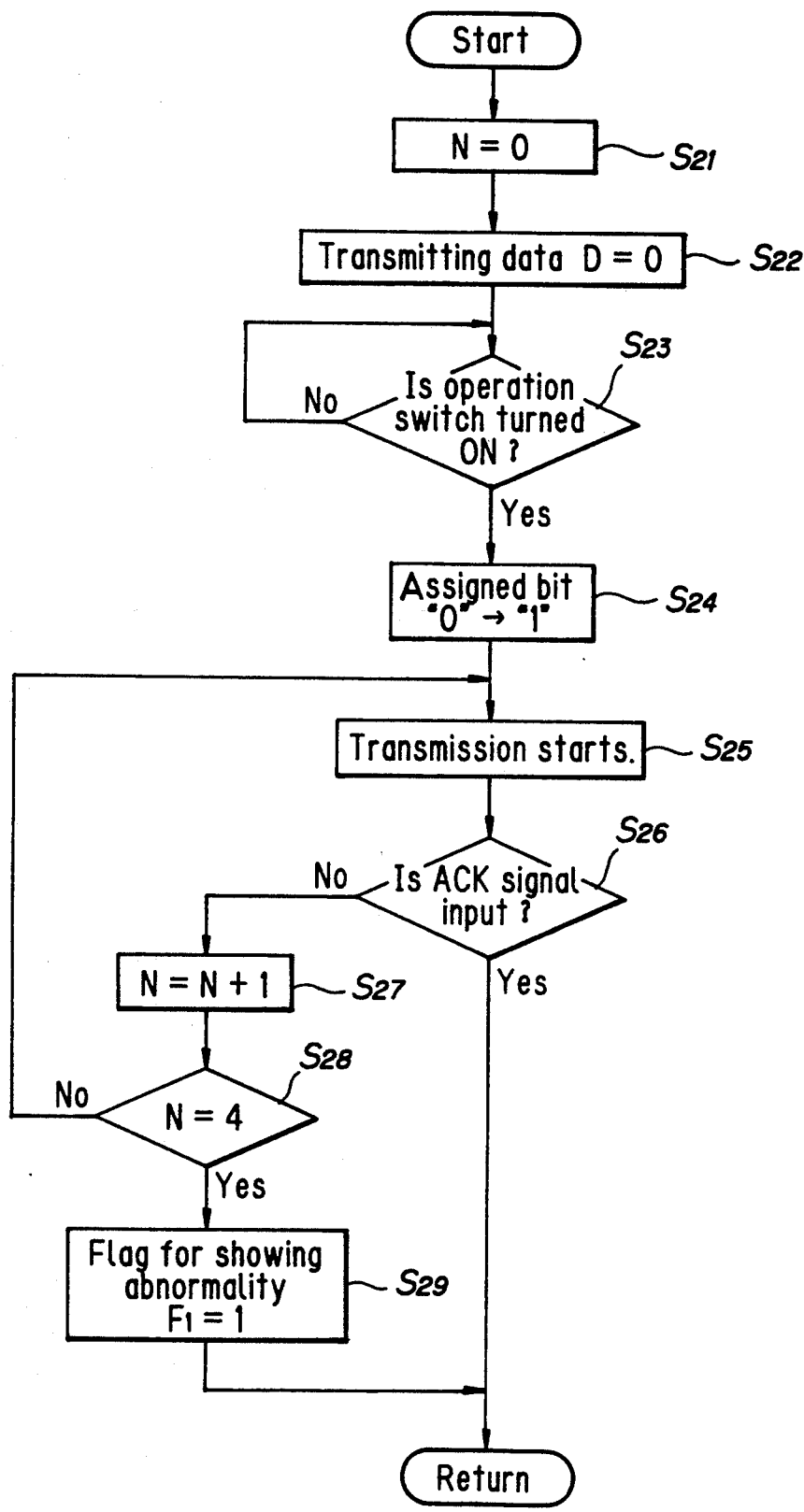

The operation of the receiver operation unit 4 will now be described with reference to FIG. 4.

When the operation starts, at first a counter N is reset to zero (Step S21), a transmitting data D of a pulse signal (for example, 8 bits including a start signal and an end signal) from the receiver operation unit 4 is subjected to initialization (Step S22), and it is decided whether or not either one of the operation switches in the receiver operation unit 4 is in a state ON (Step S23).

If either one of the operation switches is in a state ON, the process is moved to Step S24. On the other hand, if all of the operation switches are in a state OFF, the above mentioned decision is repeated until either one of the operation switches comes into a state ON. In Step S24, an assignment bit assigned for the turned on switch is made from a 0 level to a 1 level. In Step S25, the receiver operation unit 4 starts transmitting to the receiver main body 1, and in Step S26, it is decided whether or not an ACK signal confirming the reception at the receiver main body 1 is input to the receiver operation unit 4 from the receiver main body 1.

If the ACK signal is input to the receiver operation unit 4, the process is moved to the Return position. If the ACK signal is not input, the reading of the counter N is made to be N+1 in Step S27, and it is decided whether or not N=4 in Step S28. Here, the decision of the transmission of the ACK signal from the receiver main body 1 is repeated because there exists a case where the reception is not immediately carried out at the receiver main body 1 due to noises and so forth.

Consequently, if N equals 4, it is judged that the ACK signal has not been transmitted since the pulse signal from the receiver operation unit 4 has not been received by the receiver main body 1 due to some abnormal state. Then, a flag F1=1 for indicating an abnormality is set (Step S29), and the process is moved to the Return position. On the other hand, if N does not represent 4, the process is returned to Step S25.

Figure 5:
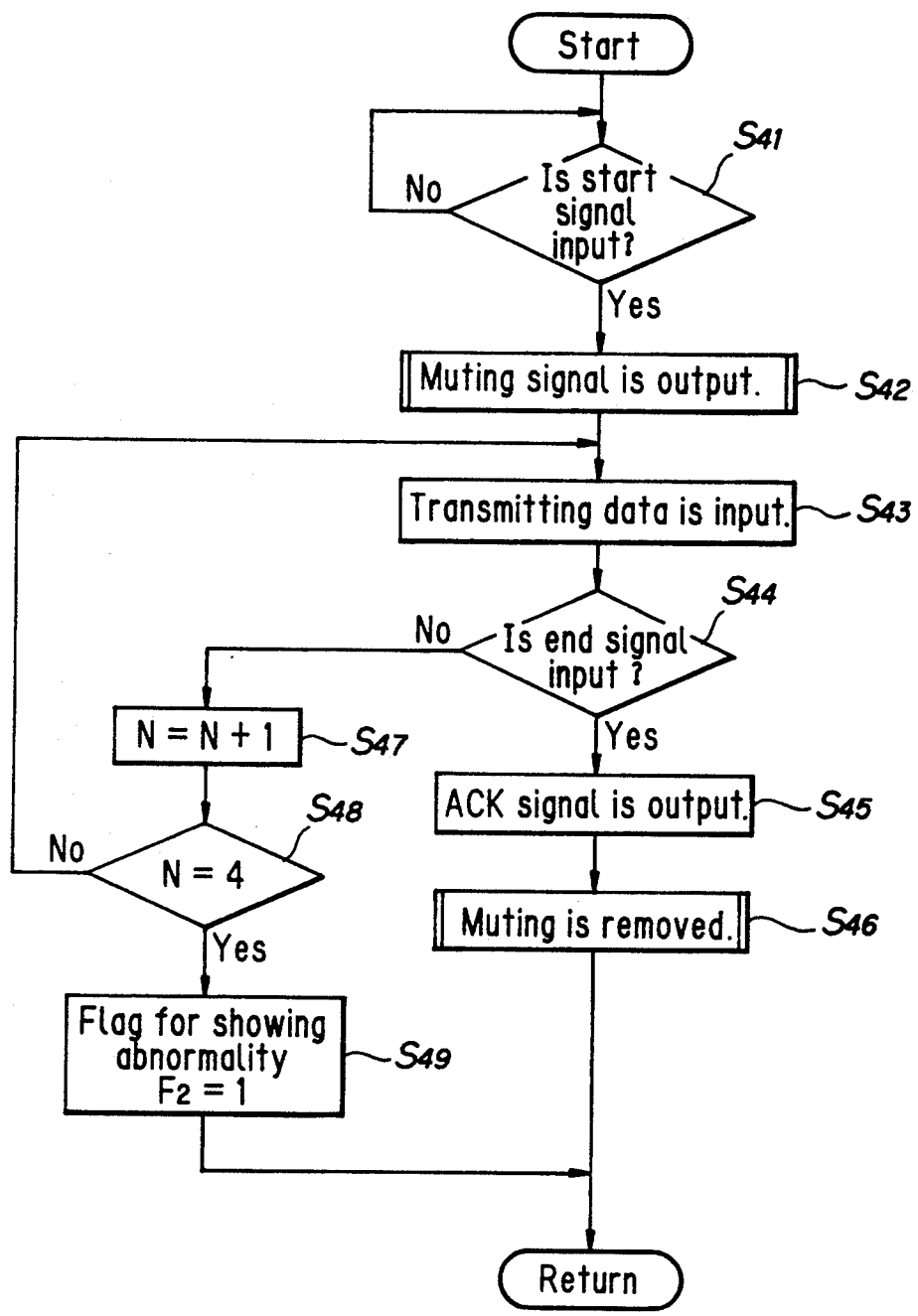

Also, the control of the controller 43 is carried out as shown in FIG. 5.

At first, when the controller 43 starts, it is decided whether or not a start signal from the receiver operation unit 4 is input thereto (Step S41). If the start signal is present at the controller 43, the process is moved to Step S42. On the other hand, if the start signal is not present, the decision in Step S41 is repeated.

In Step S42, in order to prevent noises caused by the pulse signal from the receiver operation unit 4 received by the receiver main body 1 via antennas 21, 22 and 31 from being audibly output from the speakers 11, 12, 13 and 14, the controller 43 sends the muting signal to the muting circuit 29, and in response the muting circuit 29 lowers the output from the receiver main body 1.

Then, in Step S43, the controller 43 is supplied with a transmitting data D from the receiver operation unit 4, and next it is decided whether or not an end signal is input thereto not from the receiver operation unit 4 thereto (Step S44).

If the controller 43 has been supplied with the end signal, the controller 43 installed in the receiver main body 1 sends the ACK signal for confirming the reception to the receiver operation unit 4. In this state, the muting operation by the muting circuit 29 is removed in Step S46 because there is no possibility that noises caused by the pulse signal received by the receiver main body 1 via antennas 21, 22 and 31 will be audibly output from the speakers 11, 12, 13 and 14, whereby the outputs from the receiver main body 1 are no longer to be lowered, and the process goes back to Return position. On the other hand, if the controller 43 has not been supplied with the end signal, since the possibility of an occurring abnormality exists, the reading of a counter N is made to be N+1 in Step S47, and it is decided whether or not N=4 in Step S48.

Consequently, if N equals 4, it is judged that some abnormal state exists, and the controller 43 does not transmit the ACK signal to the receiver operation unit 4. Then, a flag F2=1 for indicating an abnormality is set (Step S49), and the process is moved to the Return position. On the other hand, if N does not equal 4, the process is returned to Step S43, and the processings of Steps S43 through S48 are repeated.

In this way, when the start signal of a transmitting data D from the receiver operation unit 4 is supplied to the controller 43, the muting operation is carried out by the muting circuit 29. Therefore, noises generated by the pulse signal from the receiver operation unit 4 are not output from the speakers 11, 12, 13 and 14.

According to this invention, since the output derived from the receiver main body is forcibly and continuously lowered during a time in which the pulse signal is transmitted from the receiver operation unit, noises due to the pulse signal sent to the receiver main body are not audibly output from the speakers.

Furthermore, according to the invention, because the control means is integrated with the PLL circuit in one body and accomodated in the receiver main body, the noise generating source is unified, whereby countermeasures for shielding may be easily carried out.

What is claimed is:

1. A receiver for a vehicle comprising:
   a receiver main body provided adjacent to an antenna mounted on a vehicle body;
   a receiver operating unit, provided in a compartment of the vehicle spaced from said receiver body and connected to said receiver main body by a multiple line, for sending a data pulse signal operating said receiver main body thereto via said multiple line, said data pulse signal constituting a series of transmission data with a start signal at the beginning thereof and an end signal set at the end thereof;
   a muting means lowering an output derived from said receiver main body during an entirety of a time in which a muting signal is supplied thereto;
   a control means supplying said muting signal to said muting means continuously between the time when said start signal included in said data pulse signal is input thereto and the time when said end signal is supplied thereto.

2. A receiver for a vehicle according to claim 1, wherein said transmission data contains an operational data representing an operational state of either of operational switches provided to said receiver operation unit.

3. A receiver for a vehicle according to claim 1, wherein said muting signal lowers the output from said receiver main body between said receiver main body and an amplifier.

4. A receiver for a vehicle according to claim 1, wherein said muting signal lowers the output from said receiver main body between an amplifier and a speaker.

* * * * *